US006967408B1

(12) United States Patent
Ko

(10) Patent No.: US 6,967,408 B1
(45) Date of Patent: Nov. 22, 2005

(54) GATE STACK STRUCTURE

(75) Inventor: Kei-Yu Ko, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/579,402

(22) Filed: May 25, 2000

Related U.S. Application Data

(62) Division of application No. 08/846,671, filed on Apr. 30, 1997, now Pat. No. 6,849,557.

(51) Int. Cl.$^7$ ............................................. H01L 23/04
(52) U.S. Cl. ...................... 257/774; 257/773; 257/751; 257/758; 257/754
(58) Field of Search ................................ 257/288, 368, 257/900, 751, 774, 758, 754, 773

(56) References Cited

U.S. PATENT DOCUMENTS

| 4,381,201 A | | 4/1983 | Sakurai | |
|---|---|---|---|---|
| 4,472,729 A | | 9/1984 | Shibata et al. | |
| 4,489,478 A | | 12/1984 | Sakurai | |
| 4,672,740 A | * | 6/1987 | Shirai et al. | 438/655 |
| 4,681,657 A | | 7/1987 | Hwang et al. | 156/657 |

(Continued)

FOREIGN PATENT DOCUMENTS

| EP | 265584 | * | 5/1988 | ................... 216/51 |

(Continued)

OTHER PUBLICATIONS

"Mechanisms of High PSG/Silicon Dioxide Selective Etching In a Highly Polymerized Fluorocarbon Plasma"; Jpn. J. Appl. Phys. Part I; (1991); I Kegami et al., pp. 1556-1561; 30(7).

(Continued)

Primary Examiner—George Eckert
Assistant Examiner—Eugene Lee
(74) Attorney, Agent, or Firm—Wells St. John P.S.

(57) ABSTRACT

The present invention relates to gate stack structure that is fabricated by a process for selectively plasma etching a structure upon a semiconductor substrate to form a designated topographical structure thereon utilizing an undoped silicon dioxide layer as an etch stop. In one embodiment, a substantially undoped silicon dioxide layer is formed upon a layer of semiconductor material. A doped silicon dioxide layer is then formed upon said undoped silicon dioxide layer. The doped silicon dioxide layer is etched to create the topographical structure. The etch has a material removal rate that is at least 10 times higher for doped silicon dioxide than for undoped silicon dioxide or the semiconductor material. One application of the inventive process includes selectively plasma etching a multilayer structure to form a self-aligned contact between adjacent gate stacks and a novel gate structure resulting therefrom. In the application, a multilayer structure is first formed comprising layers of silicon, gate oxide, polysilicon, and tungsten silicide. An undoped silicon dioxide layer is formed over the multilayer structure. After patterning and etching, the multilayer structure to form gate stacks therefrom, a layer silicon nitride is deposited and is etched to create spacers on the gate stacks that are generally perpendicular to the silicon layer. Doped silicon dioxide is then deposited over the gate stacks and corresponding spacers. A photoresist layer is utilized to expose selective portions of silicon dioxide layer above the contacts on the silicon layer that are to be exposed by etching down through the doped silicon dioxide layer. The doped silicon dioxide is then selectively etched using an anisotropical plasma etch that utilizes a carbon fluorine etch. The novel gate stack structure comprising an undoped silicon dioxide cap is capable of resisting a carbon fluorine etch.

29 Claims, 3 Drawing Sheets

U.S. PATENT DOCUMENTS

| | | | |
|---|---|---|---|
| 4,753,709 A | 6/1988 | Welch et al. ............... | 156/643 |
| 4,807,016 A | 2/1989 | Douglas ..................... | 357/67 |
| 4,818,335 A | 4/1989 | Karnett ...................... | 156/644 |
| 4,966,865 A | 10/1990 | Welch et al. ............... | 437/192 |
| 5,022,958 A | 6/1991 | Favreau et al. | |
| 5,037,777 A | 8/1991 | Mele et al. .................. | 437/195 |
| 5,063,169 A * | 11/1991 | De Bruin et al. .... | 148/DIG. 26 |
| 5,084,417 A * | 1/1992 | Joshi et al. ................. | 437/192 |
| 5,150,276 A * | 9/1992 | Gonzalez et al. ........... | 361/313 |
| 5,192,703 A * | 3/1993 | Lee et al. ................... | 438/396 |
| 5,208,176 A * | 5/1993 | Ahmad et al. .............. | 257/499 |
| 5,210,047 A * | 5/1993 | Woo et al. ........... | 148/DIG. 19 |
| 5,229,311 A * | 7/1993 | Lai et al. .................... | 438/143 |
| 5,252,517 A * | 10/1993 | Blalock et al. ............. | 437/195 |
| 5,269,879 A | 12/1993 | Rhoades et al. ............ | 156/643 |
| 5,286,344 A | 2/1994 | Blalock et al. ............. | 156/657 |
| 5,298,465 A | 3/1994 | Levy .......................... | 437/225 |
| 5,312,768 A * | 5/1994 | Gonzalez .................... | 438/227 |
| 5,321,286 A | 6/1994 | Koyama et al. ............ | 257/315 |
| 5,323,047 A | 6/1994 | Nguyen ...................... | 257/758 |
| 5,362,666 A * | 11/1994 | Dennison .................... | 437/52 |
| 5,366,590 A | 11/1994 | Kadomura .................. | 156/662 |
| 5,374,332 A | 12/1994 | Koyama et al. ............ | 156/643 |
| 5,393,704 A * | 2/1995 | Huang et al. ............... | 438/305 |
| 5,401,681 A * | 3/1995 | Dennison .................... | 437/60 |
| 5,403,779 A * | 4/1995 | Joshi et al. ................. | 438/634 |
| 5,422,308 A | 6/1995 | Nicholls et al. ............ | 437/192 |
| 5,423,945 A | 6/1995 | Marks et al. ........... | 156/662.1 |
| 5,429,070 A | 7/1995 | Campbell et al. ....... | 118/723 R |
| 5,430,328 A * | 7/1995 | Hsue .......................... | 257/750 |
| 5,445,712 A | 8/1995 | Yanagida .................... | 156/662 |
| 5,478,772 A * | 12/1995 | Fazan .................. | 148/DIG. 14 |
| 5,482,894 A * | 1/1996 | Havemann .................. | 438/623 |
| 5,485,035 A | 1/1996 | Lin et al. .................... | 257/637 |
| 5,550,071 A * | 8/1996 | Ryou .......................... | 438/305 |
| 5,611,888 A | 3/1997 | Bosch et al. ............... | 156/643 |
| 5,626,716 A | 5/1997 | Bosch et al. ............... | 438/723 |
| 5,643,819 A * | 7/1997 | Tseng ......................... | 437/60 |
| 5,658,425 A | 8/1997 | Halman et al. ............. | 438/620 |
| 5,677,227 A | 10/1997 | Yang et al. .................. | 437/60 |
| 5,685,914 A | 11/1997 | Hills et al. .................. | 118/723 |
| 5,685,951 A | 11/1997 | Torek et al. ............ | 156/646.1 |
| 5,700,731 A * | 12/1997 | Lin et al. .................... | 438/381 |
| 5,705,427 A * | 1/1998 | Chan et al. ................. | 438/612 |
| 5,712,202 A * | 1/1998 | Liaw et al. ................. | 438/253 |
| 5,731,130 A * | 3/1998 | Tseng ......................... | 430/316 |
| 5,731,242 A * | 3/1998 | Parat et al. ................. | 438/211 |
| 5,736,455 A * | 4/1998 | Iyer et al. ................... | 138/592 |
| 5,747,369 A | 5/1998 | Kantimahanti et al. ..... | 438/241 |
| 5,780,338 A | 7/1998 | Jeng et al. .................. | 438/253 |
| 5,783,496 A | 7/1998 | Flanner et al. ............. | 438/743 |
| 5,792,689 A * | 8/1998 | Yang et al. ................. | 438/253 |
| 5,792,703 A * | 8/1998 | Bronner et al. ............ | 438/620 |
| 5,817,579 A | 10/1998 | Ko et al. .................... | 438/740 |
| 5,821,594 A | 10/1998 | Kasai ......................... | 257/410 |
| 5,828,096 A | 10/1998 | Ohno et al. | |
| 5,830,807 A | 11/1998 | Matsunaga et al. ......... | 438/714 |
| 5,831,899 A * | 11/1998 | Wang et al. ................ | 365/156 |
| 5,851,896 A | 12/1998 | Summerfelt ................ | 438/396 |
| 5,871,659 A | 2/1999 | Sakano et al. ............... | 216/79 |
| 5,883,436 A | 3/1999 | Sadjadi et al. .............. | 257/760 |
| 5,897,352 A * | 4/1999 | Lin et al. .................... | 438/255 |
| 5,908,320 A | 6/1999 | Chu et al. ................... | 437/743 |
| 5,918,120 A * | 6/1999 | Huang ........................ | 438/239 |
| 5,920,796 A * | 7/1999 | Wang et al. ................ | 438/700 |
| 5,936,272 A * | 8/1999 | Lee ............................. | 257/306 |
| 5,946,568 A | 8/1999 | Hsiao et al. ................ | 438/253 |
| 5,986,299 A * | 11/1999 | Nakamura et al. .......... | 257/295 |
| 5,990,507 A * | 11/1999 | Mochizuki et al. ......... | 257/295 |
| 6,065,481 A | 5/2000 | Fayfield et al. | |
| 6,074,488 A | 6/2000 | Roderick et al. ........... | 118/728 |
| 6,074,958 A | 6/2000 | Tokunaga et al. ........... | 438/724 |
| 6,117,788 A | 9/2000 | Ko ............................. | 438/706 |
| 6,117,791 A | 9/2000 | Ko et al. .................... | 438/723 |
| 6,121,671 A | 9/2000 | Ko et al. .................... | 257/644 |
| 6,124,191 A * | 9/2000 | Bohr ........................... | 438/595 |
| 6,153,490 A | 11/2000 | Xing et al. .................. | 438/396 |
| 6,159,862 A | 12/2000 | Yamada et al. ............. | 438/712 |
| 6,165,880 A | 12/2000 | Yaung et al. ............... | 438/592 |
| 6,171,970 B1 | 1/2001 | Xing et al. .................. | 438/706 |
| 6,174,451 B1 | 1/2001 | Hung et al. ................... | 216/67 |
| 6,183,655 B1 | 2/2001 | Wang et al. ................ | 438/723 |
| 6,242,759 B1 | 6/2001 | Yamazaki et al. ............ | 257/69 |
| 6,254,966 B1 | 7/2001 | Kondo ........................ | 428/156 |
| 6,271,542 B1 | 8/2001 | Emma et al. ................. | 257/67 |
| 6,277,758 B1 | 8/2001 | Ko ............................. | 438/706 |
| 6,337,285 B1 | 1/2002 | Ko ............................. | 438/714 |
| 6,362,109 B1 | 3/2002 | Kim et al. | |
| 6,362,527 B1 * | 3/2002 | Mehta ........................ | 257/758 |
| 6,372,605 B1 | 4/2002 | Kuehne et al. | |
| 6,432,833 B1 | 8/2002 | Ko ............................. | 438/714 |
| 6,458,685 B2 | 10/2002 | Ko et al. .................... | 438/621 |

FOREIGN PATENT DOCUMENTS

| | | |
|---|---|---|
| EP | 0 465 044 A2 | 6/1991 |
| EP | 0 496 614 A1 | 1/1992 |
| EP | 0 680 084 A1 | 4/1995 |
| EP | 0 763 850 A1 | 8/1996 |
| JP | 56-114355 | 9/1981 |
| JP | 61-133555 | 3/1984 |
| JP | 60-042821 | 3/1985 |
| JP | 61-133666 | 6/1986 |
| JP | 6146/91 | 8/1992 |
| JP | 04-345054 | 12/1992 |
| JP | 4-360570 | 12/1992 |
| JP | 5-335482 | 12/1993 |
| JP | 6-69166 | 3/1994 |
| JP | 8-181121 | 7/1996 |
| JP | 8-250449 | 9/1996 |
| WO | WO 98/49719 | 11/1998 |

OTHER PUBLICATIONS

Abatchev et al., *Study of the Boron-Phosphorous Doped and Undoped Silicate Glass Etching in CHF2/Ar Plasma*, 96 Electrochem. Soc. Proceedings, No. 12, pp. 522-530 (1996).

U.S. Appln. No. 09/532,088, filed Mar. 21, 2000, Ko.

U.S. Appln. No. 09/945,508, filed Aug. 30, 2001, Ko.

W.G.M. van den Hoek et al., *Isotropic plasma etching of doped and undoped silicon dioxide for contact holes and vias*, 7 J. Vac. Sci. Technol. A., No. 3, pp. 670-675 (May/Jun. 1989).

* cited by examiner

US 6,967,408 B1

GATE STACK STRUCTURE

This is a divisional application of U.S. patent application Ser. No. 08/846,671, filed on Apr. 30, 1997 U.S. Pat. No. 6,849,557 titled "UNDOPED SILICON DIOXIDE AS ETCH STOP FOR SELECTIVE ETCH OF DOPED SILICON DIOXIDE", which is incorporated herein by reference.

BACKGROUND OF THE INVENTION

1. The Field of the Invention

The present invention involves an etching process that utilizes an undoped silicon dioxide layer as an etch stop during a selective etch of a doped silicon dioxide layer that is situated on a semiconductor substrate. More particularly, the present invention relates to a process for selectively utilizing a fluorinated chemistry in a plasma etch system for etching a doped silicon dioxide layer situated upon an undoped silicon dioxide layer that acts as an etch stop.

2. The Relevant Technology

Modern integrated circuits are manufactured by an elaborate process in which a large number of electronic semiconductor devices are integrally formed on a semiconductor substrate. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

Conventional semiconductor devices which are formed on a semiconductor substrate include capacitors, resistors, transistors, diodes, and the like. In advance manufacturing of integrated circuits, hundreds of thousands of these semiconductor devices are formed on a single semiconductor substrate. In order to compactly form the semiconductor devices, the semiconductor devices are formed on varying levels of the semiconductor substrate. This requires forming a semiconductor substrate with a topographical design.

The semiconductor industry is attempting to increase the speed at which integrated circuits operate, to increase the density of devices on the integrated circuits, and to reduce the price of the integrated circuits. To accomplish this task, the semiconductor devices used to form the integrated circuits are continually being increased in number and decreased in dimension in a process known as miniaturization.

One component of the integrated circuit that is becoming highly miniaturized is the active region. An active region is a doped area in a semiconductor substrate that is used together with other active regions to form a diode or a transistor. The miniaturization of the active region complicates the formation of the interconnect structure in that, in order to maintain sufficient electrical communication, the interconnect structure must be formed in exact alignment with the active region. Also, the area of the interconnect structure interfacing with the active region must be maximized. Thus, less area is provided as tolerance for misalignment of the interconnect structure.

The increasing demands placed upon manufacturing requirements for the interconnect structure have not been adequately met by the existing conventional technology. For example, it is difficult at greater miniaturization levels to exactly align the contact hole with the active region when patterning and etching the contact hole. As a result, topographical structures near the bottom of the contact hole upon the active region can be penetrated and damaged during etching of the contact hole. The damage reduces the performance of the active region and alters the geometry thereof, causing a loss of function of the semiconductor device being formed and possibly a defect condition in the entire integrated circuit. To remedy these problems, the prior art uses an etch stop to prevent over etching.

In a conventional self-aligned etch process for a contact hole, a silicon nitride layer or cap is usually used on top of a gate stack as an etch stop layer during the self-aligned contact etch process. One of the problems in the prior art with forming a silicon nitride cap was the simultaneous formation of a silicon nitride layer on the back side of the semiconductor wafer. The particular problems depend on the process flow. For instance, where a low pressure chemical vapor deposition is used to deposit silicon nitride, both sides of the semiconductor wafer would receive deposits of silicon nitride. The presence of the silicon nitride on the back side of the semiconductor wafer causes stress which deforms the shape of the semiconductor wafer, and can also potentially cause deformation of the crystal structure as well as cause defects in the circuit. Additionally, silicon nitride deposition is inherently a dirty operation having particulate matter in abundance which tends to reduce yield. When a low pressure chemical vapor deposition process is utilized, the silicon nitride layering on the back side of the semiconductor wafer must be removed later in the process flow.

SUMMARY OF THE INVENTION

The present invention relates to a process for selectively plasma etching a semiconductor substrate to form a designated topographical structure thereon utilizing an undoped silicon dioxide layer as an etch stop. In one embodiment, a substantially undoped silicon dioxide layer is formed upon a layer of semiconductor material. A doped silicon dioxide layer is then formed upon the undoped silicon dioxide layer. The doped silicon dioxide layer is etched to create a topographical structure. The etch has a material removal rate that is at least 10 times higher for doped silicon dioxide than for the undoped silicon dioxide or the layer of semiconductor material.

One application of the inventive process includes a multilayer structure situated on a semiconductor substrate that comprises layers of a semiconductor material, a thin silicon dioxide layer, a layer of conductor material, and a refractory metal silicide layer. By way of example, the multilayer structure situated on a semiconductor substrate may consist of a gate oxide situated on a silicon substrate, a layer of polysilicon, and a refractory metal silicide layer on the layer of polysilicon. A substantially undoped silicon dioxide layer is then formed over the multilayer structure.

The multilayer structure is then patterned to form the designated topography. Doped silicon dioxide is then formed on the semiconductor substrate as a passivation layer. A photoresist layer is utilized to expose selected portions of the doped silicon dioxide layer that are intended to be etched. One example of a topographical structure created utilizing this process are gate stacks. The doped silicon dioxide is then selectively and anisotropically etched with a carbon fluorine etch recipe so as to self-align contact holes down to the semiconductor substrate between the gate stacks.

Each gate stack has a cap composed of substantially undoped silicon dioxide. A layer of silicon nitride or undoped silicon dioxide is deposited over the gate stacks and the semiconductor substrate therebetween. A spacer etch is performed to create silicon nitride or undoped silicon dioxide spacers on the side of each gate stack. The silicon nitride or undoped silicon dioxide spacers are generally perpendicular to the base silicon layer.

The present invention contemplates a plasma etching process for anisotropic etching a doped silicon dioxide layer situated on an undoped silicon dioxide layer that acts as an etch stop. One application of the present invention is the formation of gate stacks having spacers composed of substantially undoped silicon dioxide. The undoped silicon dioxide spacers act as an etch stop. Novel gate structures are also contemplated that use a substantially undoped silicon dioxide etch stop layer for a carbon fluorine etch of a doped silicon dioxide layer, where the substantially undoped silicon dioxide etch stop layer resists etching by a carbon fluorine etch.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

The inventive process herein is directed towards selectively utilizing a plasma etch system on doped silicon dioxide ($SiO_2$) layer with a substantially undoped silicon dioxide layer as an etch stop. One application of the inventive process is to form a self-aligned contact. The present invention also discloses an inventive multilayer gate structure.

Figure 1:
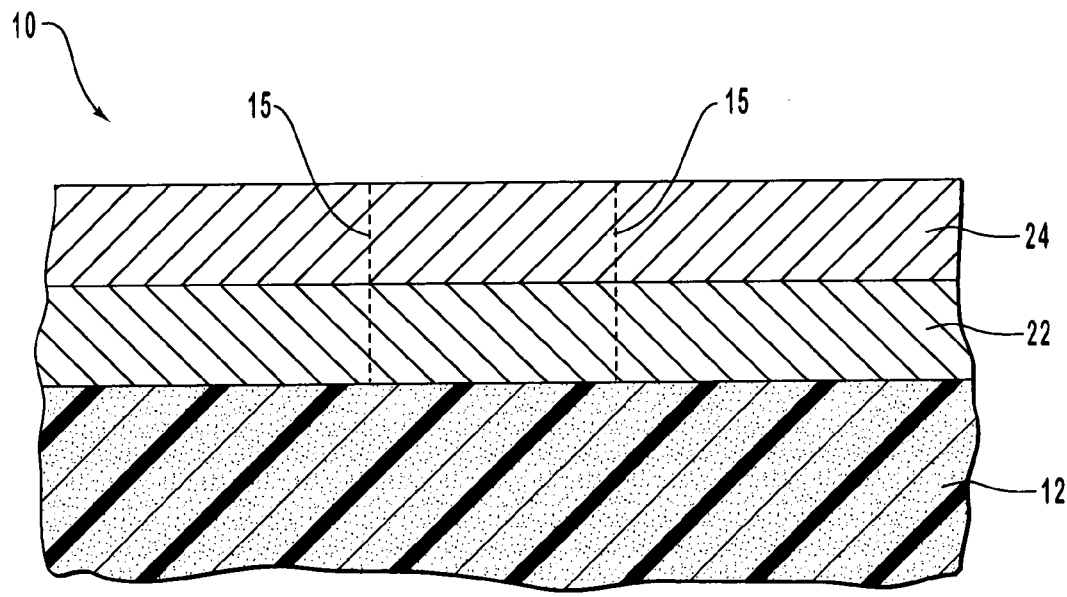
FIG. 1 is a partial cross-sectional elevation view of one embodiment of a multilayer structure prior to an etch, the multi-layer structure including a base silicon layer and a layer of undoped silicon dioxide, where the multi-layer structure has a layer of photoresist, and wherein a first selected pattern is defined in phantom.

As illustrated in FIG. 1, one embodiment of a multilayer structure 10 is created that comprises a base silicon layer 12. Overlying silicon base layer 12 is a substantially undoped silicon dioxide layer 22. Undoped silicon dioxide layer 22 can be any type of undoped oxide and be formed by a thermal process, by a plasma enhanced deposition process, or by a conventional TEOS precursor deposition that is preferably rich in carbon or hydrogen, or by a precursor of gaseous silane ($SiH_4$) with oxygen. In the latter process, the gaseous silane flow will result in undoped silicon dioxide layer 22.

The next layer in the embodiment of multilayer structure 10 illustrated in FIG. 1 comprises a photoresist layer 24 that is processed to expose a first selected pattern 15, shown in phantom, such that silicon dioxide layer 22 will be used to create a topography in multilayer structure 10. Multilayer structure 10 is then anisotropically etched as shown by first selected pattern 15 to selectively remove material from undoped silicon dioxide layer 22 to form undoped silicon dioxide caps 16 as seen in FIG. 2.

A doped silicon dioxide layer 30 is deposited over multilayer structure 10 as a passivation layer. Preferably, doped silicon dioxide layer 30 is substantially composed of borophosphosilicate glass (BPSG), borosilicate glass (BSG), or phosphosilicate glass (PSG). Most preferably, doped silicon dioxide layer 30 is substantially composed of silicon dioxide having doping of about 3% or more for boron and about 3% or more for phosphorus. A photoresist layer 32 is applied over doped silicon dioxide layer 30. Photoresist layer 32 is processed to expose a second selected portion 17 of doped silicon dioxide layer 30 that is intended to be etched. Second selected portion 17 is seen in phantom in FIG. 2.

Figure 2:
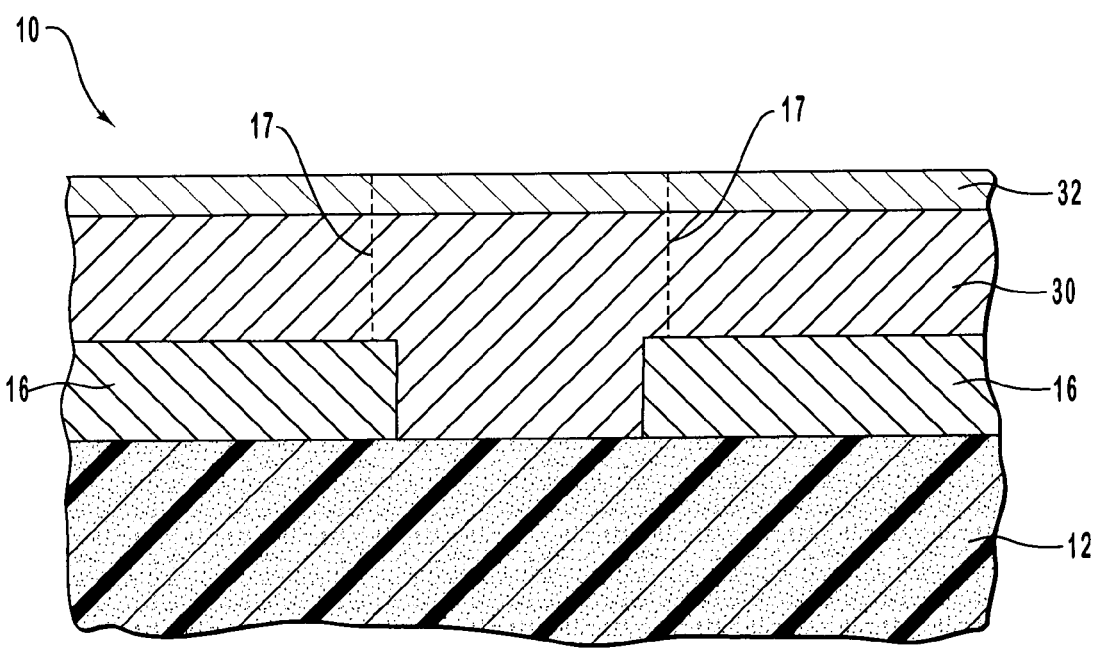
FIG. 2 is a partial cross-sectional elevation view of the structure seen in FIG. 1, wherein the layer of undoped silicon dioxide has been etched so as to form a recess terminating upon the base silicon layer, a layer of doped silicon dioxide has been deposited thereover, where a layer of photoresist is formed over the layer of doped silicon dioxide, and wherein a second selected pattern is defined in phantom which is intended to represent an etch through the layer of doped silicon dioxide to expose a contact on the base silicon layer that is self-aligned between the layer of undoped silicon dioxide, wherein the self-alignment of the etch is due to the selectivity of the etch to undoped silicon dioxide.

The structure seen in FIG. 2 is now etched with a fluorinated or fluorocarbon chemical etchant system to form second selected pattern 17 as illustrated in FIG. 2. The preferred manner is an anisotropic plasma etch of doped silicon dioxide layer 30 down to the corresponding etch stop layer of undoped silicon dioxide cap 16. The plasma etch technique employed herein is preferably generated under a vacuum within the confines of a discharging unit and involves any type of a plasma system, including a high density plasma etcher. A conventional radio frequency reactive ion etcher (RF RIE) plasma system, a magnetically enhanced RIE (MERIE) plasma system, or an inductively coupled plasma system could be used. The preferred embodiment, however, is an RF type RIE or MERIE plasma system. It is preferred the plasma system being used has a plasma density in a range from about $10^9/cm^3$ to about $10^{11}/cm^3$ A high density plasma system can also be used having a plasma density in a range from about $10^{12}/cm^3$ to about $10^{13}/cm^3$.

Figure 3:
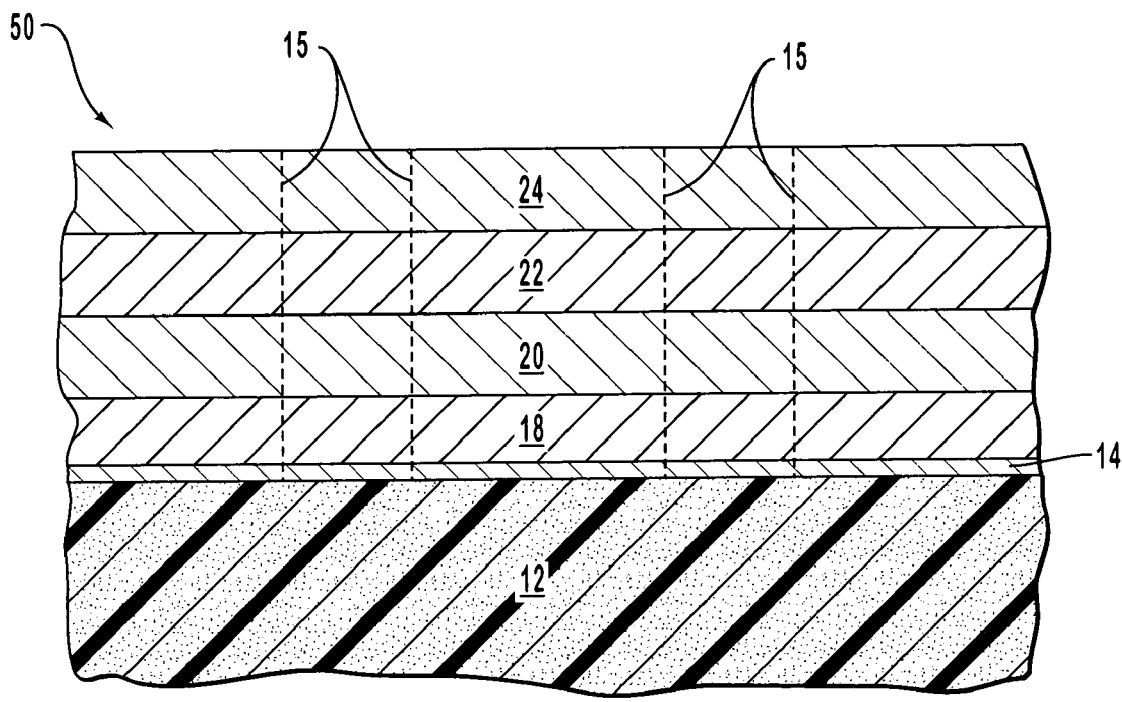
FIG. 3 is a partial cross-sectional elevation view of one embodiment of a multilayer structure prior to an etch, the multilayer structure including a base silicon layer and having thereon layers of gate oxide, polysilicon, tungsten silicide, and undoped silicon dioxide, where the multi-layer structure has a layer of photoresist, and wherein a first selected pattern is defined in phantom.

One particular embodiment of a specific structure created utilizing the inventive process is illustrated in FIG. 3 wherein a multilayer structure 50 is created that comprises a base silicon layer 12. Overlying silicon base layer 12 is a gate oxide layer 14 that covers silicon base layer 12. Gate oxide layer 14 may be relatively thin in comparison with the other layers of the multilayered structure. The next layer in multilayer structure 50 comprises a polysilicon gate layer 18. Overlying polysilicon gate layer 18 is a refractory metal silicide layer 20. A known benefit of refractory metal silicides is their low resistivity. Refractory metal silicide layer 20 may comprise any refractory metal including but not limited to titanium, tungsten, tantalum, and molybdenum. Preferably, refractory metal silicide layer 20 is substantially composed of tungsten silicide ($WSi_x$).

Figure 4:
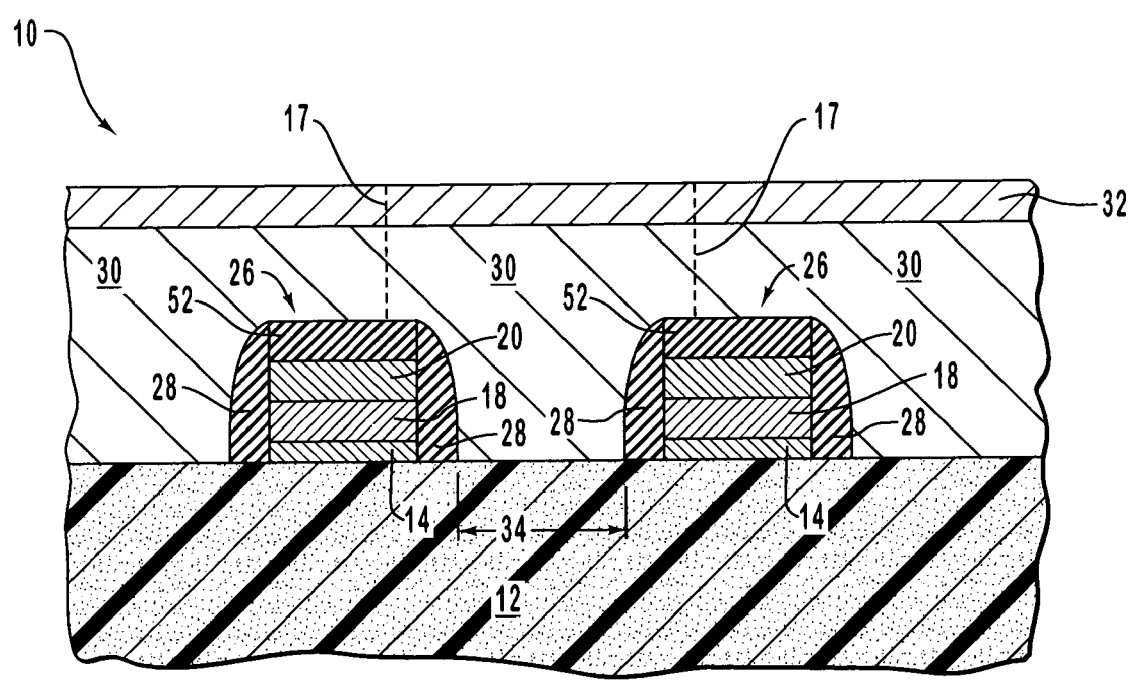
FIG. 4 is a partial cross-sectional elevation view of the structure seen in FIG. 3, wherein gate stacks are formed upon the base silicon layer, each gate stack having a spacer on a sidewall thereof and a cap on the top thereof, the gate stacks having deposited thereover a layer of doped silicon dioxide, and a layer of photoresist is deposited upon the layer of doped silicon dioxide, wherein a second selected pattern is defined in phantom which is intended to represent a fluorinated chemical etch through the layer of doped silicon dioxide to expose a contact on the base silicon layer that is self-aligned between the gate stacks, wherein the self-alignment of the etch is due to the selectivity of the etch to the materials of the spacers and the cap of the gate stacks.

Overlying refractory metal silicide layer 20 is a substantially undoped silicon dioxide layer 22 which can be formed thermally, by plasma enhanced deposition, by a conventional TEOS precursor deposition that is preferably rich in carbon or hydrogen, or by a precursor of gaseous silane ($SiH_4$) with oxygen. The next layer in multilayer structure 50 is a photoresist layer 24 that is processed to expose a first selected pattern 15 shown in phantom. Multilayer structure 50 is then etched according to first selected pattern 15 to selectively remove material so as to form gate stacks 26 as illustrated in FIG. 4. Each gate stack 26 has an undoped silicon dioxide cap 52 thereon which was formed from undoped silicon dioxide layer 22.

A spacer 28 is on the sidewall of each gate stack 26. Spacers 28 are formed by subjecting a layer of silicon nitride deposited over gate stacks 26 to a spacer etch. Silicon nitride spacers 28 are generally perpendicular to silicon base layer 12. Alternatively, spacers 28 can be substantially composed of undoped silicon dioxide. As such, both spacers 28 and undoped silicon dioxide caps 52 can be made from the same materials and both act as an etch stop.

Once gate stacks 26 are formed, a contact 34 is defined therebetween upon silicon base layer 12. At this point in the processing, a doped silicon dioxide layer 30, composed of a material such as PSG, BSG, or BPSG, is deposited over multilayer structure 50. A photoresist layer 32 is then applied over doped silicon dioxide layer 30. Photoresist layer 32 is processed to create a second selected pattern 17 that is illustrated in phantom in FIG. 4.

The structure seen in FIG. 4 is now etched with a fluorinated or fluorocarbon chemical etchant system according to second selected pattern 17. The preferred manner of etching of doped silicon dioxide layer 30 down to its corresponding etch stop layer, which is substantially undoped silicon dioxide layer 52, is by a plasma etch. The etch technique employed herein is preferably a plasma etch involving any type of a plasma system including a high density plasma etcher as previously discussed relative to FIG. 2.

One factor that effects the etch rate and the etch selectivity of the process is pressure. The total pressure has a preferred range from about 1 millitorr to about 400 millitorr. A more preferred pressure range for a plasma etch is in a pressure range from about 1 millitorr to about 100 millitorr. The most preferred pressure range for a plasma etch is from about 1 millitorr to about 75 millitorr. The pressure may be increased, however, above the most preferred ranges. For example, the RIE etch may be performed at about 100 millitorr. Selectivity can be optimized at a pressure range between about 10 millitorr and about 75 millitorr. Pressure increases may result in a loss in selectivity. The range in selectivity, however, can be adjusted to accommodate different pressures. As such, selectivity and pressure are inversely related.

Temperature is another factor that effects the selectivity of the etching process used. A preferable temperature range during the plasma etch has a range of about 10° C. to about 80° C., and more preferably about 20° C. to about 40° C. This is the temperature of a bottom electrode adjacent to silicon layer 12 during the etching process. The preferable range of the semiconductor materials is between about 40° C. and about 130° C., and more preferably between about 40° C. and about 90° C.

Undoped silicon dioxide cap 52 and silicon nitride spacers 28 protect gate stacks 26 from the fluorinated chemical etch. As illustrated in FIG. 4, the etch will selectively and anisotropically remove doped silicon dioxide layer 30 above contact 34 as indicated by second selected pattern 17. The etch removes material from doped silicon dioxide layer 30 at a higher material removal rate than that of undoped silicon dioxide cap 52 and silicon nitride spacers or undoped silicon dioxide spacers 28. Preferably, the etch has a material removal rate for doped silicon dioxide that is at least 10 times higher than that of undoped silicon dioxide. As such contact 34 is self-aligned between spacers 28 of gate stacks 26. The self-aligning aspect of contact 34 is due to the selectivity of the etch which assures that even in cases of misalignment of the exposure of second selected pattern 17, the fluorinated chemical etch through doped silicon dioxide layer 30 will properly place contact 34 on silicon base layer 12 and between adjacent silicon nitride spacers 28 that have been formed upon sides of gate stacks 26.

Figure 5:
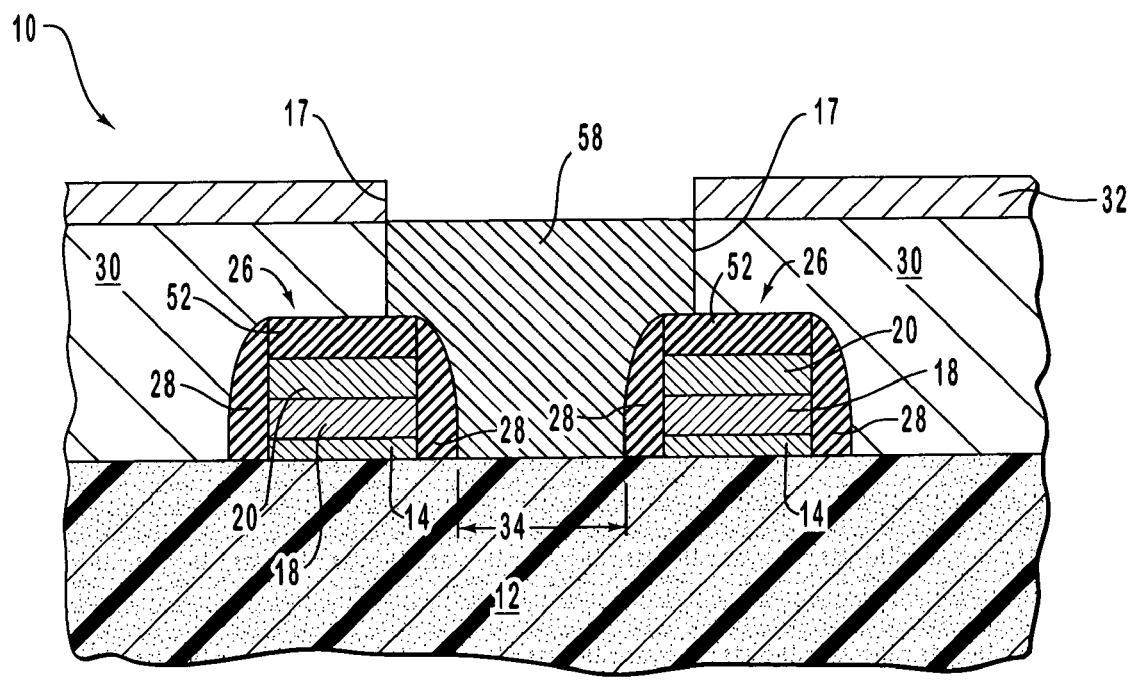
FIG. 5 shows the same view displayed in FIG. 4 with the second selected pattern filled with a contact plug.
Figure 6:
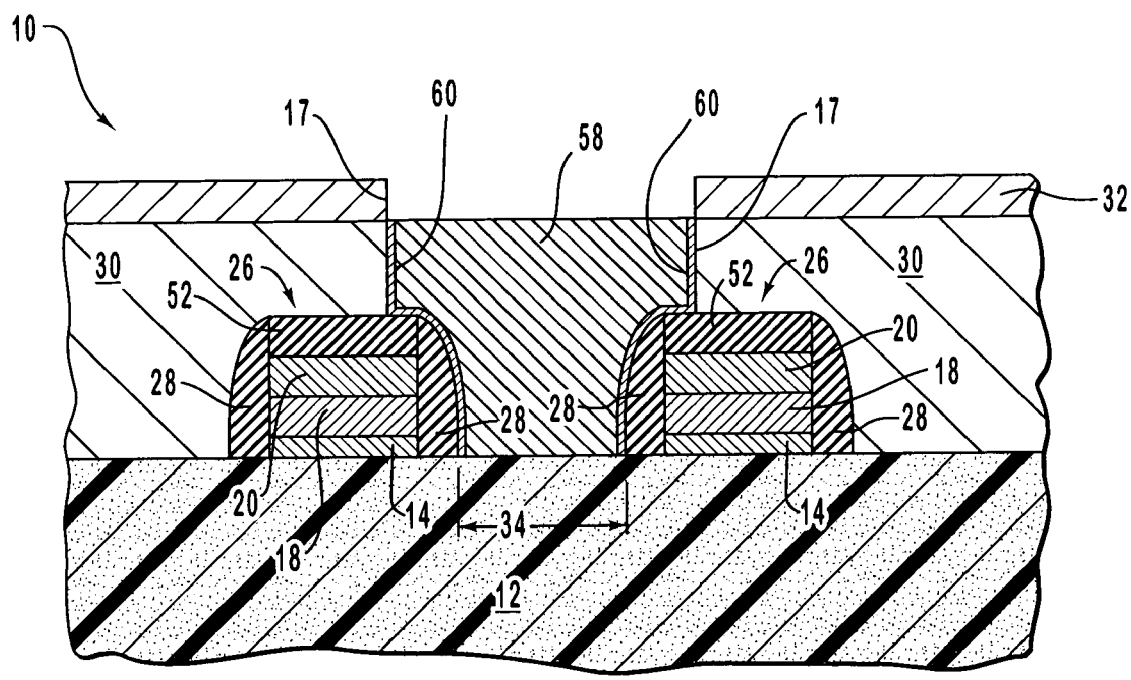
FIG. 6 shows the same view displayed in FIG. 5, where the contact plug has a layer of refractory metal or refractory metal silicide proximate thereto.

A conductive material 58 is formed upon contact 34 between spacers 28 within second selected pattern 17 as shown in FIG. 5. The conductive material will form a contact plug 58 to contact 34. It may be desirable to clad the contact plug with a refractory metal or a refractory metal silicide 60. As such, second selected pattern 17 would have proximate thereto the refractory metal or silicide thereof prior to formation of the contact plug in contact with contact 34 as schematically shown in FIG. 6.

Contact 34 is preferably exposed by an anisotropic plasma etch with a fluorinated chemistry that etches through BSG, PSG, BPSG, or doped silicon dioxide in general. The etch is preferably selective to undoped silicon dioxide, silicon, and silicon nitride. The fluorinated chemical etch utilizes a type of carbon fluorine gas from the group consisting of $C_2F_6$, $CF_4$, $C_3F_8$, $C_4F_{10}$, $C_2F_8$, $CH_2F_2$, $CHF_3$, $C_2HF_5$, $CH_3F$ and combinations thereof. There are other fluorinated etchants in a substantially gas phase during the etching of the structure. An inert gas is often used in combination with the fluorinated etchant. Argon, nitrogen, and helium are examples of such an inert gas. The preferred gasses, however, are $CF_4$, $CH_2F_2$, $CHF_3$ and Ar. Alternatively $CH_3F$ may be used in place of $CH_2F_2$. In particular, the preferred etchant is a fluorine deficient gas which is defined as a gas where there are not enough fluorine atoms to saturate the bonding for the carbon atoms.

The present invention has application to a wide variety of structures. The top layer of the gate stack, composed of undoped silicon dioxide, can be used to create and protect various types of structures during the doped silicon dioxide etching process for structures other than gate stacks.

The present invention allows the gate stack height to be reduced. One advantage of reducing the gate stack height is to reduce the process time which results in greater throughput. The reduced gate height results in a lower etch time and a reduced contact hole aspect ratio, the latter being defined as the ratio of height to width of the contact hole. By reducing the aspect ratio, or by reducing the height of the gate stack, there will be a decrease in the etch time. Another advantage of a lower gate stack height is that it reduces the overall topography which in turn results in it being easier to planarize and to use photolithographic processes. As such, the present invention increases yield.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured is:

1. A gate stack structure situated over a semiconductor material layer, said gate stack structure comprising:
   a gate oxide layer on said semiconductor material layer;
   a gate layer, comprising a first conductive material, on said gate oxide layer;
   a layer of refractory metal silicide on said gate layer;
   an undoped silicon dioxide cap on and in contact with said layer of refractory metal silicide;
   a spacer over a lateral side of the gate layer and in contact with said semiconductor material layer, said spacer comprising a nonconductive material, wherein the lateral side of the gate layer is oriented perpendicular to said base semiconductor material layer;
   a contact plug having a base in contact with said semiconductor material layer, said contact plug comprising a second conductive material and being situated adjacent to the gate layer, over said spacer, and over a portion of said undoped silicon dioxide cap, said contact plug having a top and a lateral wall extending from said top to said base, wherein said lateral wall is not vertical along its entire height from said top to said base, wherein the second conductive material physically contacts the semiconductor material layer; and
   a layer of doped silicon dioxide over and in contact with said spacer, over and in contact with said undoped silicon dioxide cap, and adjacent to and in contact with said contact plug, wherein a conductive layer is disposed along said lateral wall along the second conductive material and with said second conductive material comprises a part of said contact plug, said conductive layer having said second conductive material of said contact plug on one of its two opposite sides and having said spacer and said layer of doped silicon dioxide on the other of said sides, such that said conductive layer is only one of a refractory metal silicide or a refractory metal in physical contact with the doped silicon dioxide, with the spacer, and with the second conductive material.

2. The gate stack structure as recited in claim 1, wherein said nonconductive material comprises silicon nitride.

3. The gate stack structure as recited in claim 1, wherein:
   said nonconductive material comprises undoped silicon dioxide; and
   the spacer is made from the same material as the undoped silicon dioxide cap.

4. The gate stack structure as recited in claim 1, wherein the semiconductor material is monocrystalline silicon.

5. The gate stack structure as recited in claim 1, wherein said refractory metal silicide layer is tungsten silicide.

6. The gate stack structure as recited in claim 1, wherein said layer of doped silicon dioxide layer comprises a material selected from the group consisting of BPSG, PSG, and BSG.

7. The gate stack structure as recited in claim 1, wherein the spacer comprises a material that is one of silicon nitride and undoped silicon dioxide.

8. The gate stack structure as defined in claim 1, wherein the first conductive material is polysilicon.

9. A gate stack structure situated over a monocrystalline silicon layer, said gate stack structure comprising:
   a gate oxide layer on said monocrystalline silicon layer;
   a polysilicon gate layer on said gate oxide layer;
   a layer of tungsten silicide on said polysilicon gate layer;
   an undoped silicon dioxide cap on and in contact with said layer of tungsten silicide;
   a spacer over a lateral side of the gate layer and in contact with said monocrystalline silicon layer, said spacer comprising undoped silicon dioxide in physical contact with the undoped silicon dioxide cap, wherein the lateral side of the gate layer is oriented perpendicular to said base monocrystalline silicon layer;
   a contact plug having a base in contact with said monocrystalline silicon layer, said contact plug comprising a second conductive material and being adjacent to said gate layer, over said spacer, and over a portion of said undoped silicon dioxide cap, said contact plug having a top and a lateral wall extending from said top to said base, wherein said lateral wall is not vertical along its entire height from said top to said base, wherein the second conductive material physically contacts the semiconductor material layer; and
   a layer of doped silicon dioxide comprising a material selected from the group consisting of BPSG, PSG, and BSG, and being situated over and in contact with said spacer, over and in contact with said undoped silicon dioxide cap, and adjacent to and in contact with said contact plug, wherein a conductive layer is disposed along said lateral wall along the second conductive material and with said second conductive material comprises a part of said contact plug, said conductive layer having said second conductive material of said contact plug on one of its two opposite sides and having said spacer and said layer of doped silicon dioxide on the other of said sides, such that said conductive layer is only one of a refractory metal silicide or a refractory metal in physical contact with the doped silicon dioxide, with the spacer, and with the second conductive material.

10. A gate structure comprising:
   a pair of gate stacks situated over a semiconductor material layer, each said gate stack comprising:
   a gate oxide layer on said semiconductor material layer;
   a gate layer, comprising a first conductive material, on said gate oxide layer;
   a layer of refractory metal silicide on said gate layer;
   an undoped silicon dioxide cap on and in contact with said layer of refractory metal silicide; and
   a spacer in contact with a lateral side of each said gate stack and with said semiconductor material layer, said spacer comprising a nonconductive material, each said lateral side of each said gate stack being perpendicular to said base semiconductor material layer;
   a contact plug having a base in contact with said semiconductor material layer, said contact plug comprising a second conductive material and being situated between said pair of gate stacks, over said spacer, and over a portion of said undoped silicon dioxide cap, said contact plug having a top and a lateral wall extending from said top to said base, wherein said lateral wall is not vertical along its entire height from said top to said base, wherein the second conductive material physically contacts the semiconductor material layer; and a layer of doped silicon dioxide over and in contact with said spacer, over and in contact with said undoped silicon dioxide cap, and adjacent to and in contact with said contact plug, wherein a conductive layer is disposed along said lateral wall along the second conductive material and with said second conductive material comprises a part of said contact plug, said conductive layer having said second conductive material of said contact plug on one of its two opposite sides and having said spacer and said layer of doped silicon dioxide on the other of said sides, such that said conductive layer is only one of a refractory metal silicide or a refractory metal in physical contact with the doped silicon dioxide, with the spacer, and with the second conductive material.

11. A gate structure as recited in claim 10, wherein said nonconductive material comprises silicon nitride.

12. The gate structure as recited in claim 10, wherein:
said nonconductive material comprises undoped silicon dioxide; and
each said spacer is made from the same material as a respective one of said undoped silicon dioxide caps.

13. The gate structure as recited in claim 10, wherein the semiconductor material is monocrystalline silicon.

14. The gate structure as recited in claim 10, wherein said refractory metal silicide layer is tungsten silicide.

15. The gate structure as recited in claim 10, wherein said layer of doped silicon dioxide layer comprises a material selected from the group consisting of BPSG, PSG, and BSG.

16. The gate structure as recited in claim 10, wherein the spacer comprises a material that is one of silicon nitride and undoped silicon dioxide.

17. A gate structure as defined in claim 10, wherein the first conductive material is polysilicon.

18. A gate structure comprising:
a pair of gate stacks situated over a monocrystalline silicon layer, each said gate stack comprising:
a gate oxide layer on said monocrystalline silicon layer;
a polysilicon gate layer on said gate oxide layer;
a layer of tungsten silicide on said polysilicon gate layer;
an undoped silicon dioxide cap on and in contact with said layer of tungsten silicide; and
a spacer over a lateral side of each said gate stack and in contact with said monocrystalline silicon layer, said spacer comprising undoped silicon dioxide and being made from the same material as the undoped silicon dioxide cap, wherein the lateral side of each said gate stack is oriented perpendicular to said monocrystalline silicon layer;
a contact plug having a base in contact with said monocrystalline silicon layer, said contact plug comprising a second conductive material and being situated between said pair of gate stacks, over said spacer, and over a portion of said undoped silicon dioxide cap, said contact plug having a top and a lateral wall extending from said top to said base, wherein said lateral wall is not vertical along its entire height from said top to said base, wherein the second conductive material physically contacts the semiconductor material layer; and
a layer of doped silicon dioxide over and in contact with said spacer, over and in contact with said undoped silicon dioxide cap, and adjacent to and in contact with said contact plug, wherein a conductive layer is disposed along said lateral wall along the second conductive material and with said second conductive material comprises a part of said contact plug, said conductive layer having said second conductive material of said contact plug on one of its two opposite sides and having said spacer and said layer of doped silicon dioxide on the other of said sides, such that said conductive layer is only one of a refractory metal silicide or a refractory metal in physical contact with the doped silicon dioxide, with the spacer, and with the second conductive material.

19. A gate structure comprising:
a pair of gate stacks situated over a monocrystalline silicon layer, each said gate stack comprising:
a gate oxide layer on said monocrystalline silicon layer;
a polysilicon gate layer on said gate oxide layer;
a layer of tungsten silicide on said polysilicon gate layer;
an undoped silicon dioxide cap on and in contact with said layer of tungsten silicide; and
a spacer over a lateral side of each said gate stack and in contact with said monocrystalline silicon layer, said spacer comprising a material that is one of silicon nitride and undoped silicon dioxide, each said lateral side of each said gate stack being perpendicular to said monocrystalline silicon layer;
a contact plug having a base in contact with said monocrystalline silicon layer, said contact plug comprising a second conductive material and being situated between said pair of gate stacks, over said spacer, and over a portion of said undoped silicon dioxide cap, said contact plug having a top and a lateral wall extending from said top to said base, wherein said lateral wall is not vertical along its entire height from said top to said base, wherein the second conductive material physically contacts the semiconductor material layer; and
a layer of doped silicon dioxide over and in contact with said spacer, over and in contact with said undoped silicon dioxide cap, and adjacent to and in contact with said contact plug, wherein a conductive layer is disposed along said lateral wall along the second conductive material and with said second conductive material comprises a part of said contact plug, said conductive layer having said second conductive material of said contact plug on one of its two opposite sides and having said spacer and said layer of doped silicon dioxide on the other of said sides, such that said conductive layer is only one of a refractory metal silicide or a refractory metal in physical contact with the doped silicon dioxide, with the spacer, and with the second conductive material.

20. The gate structure of claim 1 wherein the conductive layer is only a refractory metal silicide.

21. The gate structure of claim 1 wherein the conductive layer is only a refractory metal.

22. The gate structure of claim 9 wherein the conductive layer is only a refractory metal silicide.

23. The gate structure of claim 9 wherein the conductive layer is only a refractory metal.

24. The gate structure of claim 10 wherein the conductive layer is only a refractory metal silicide.

25. The gate structure of claim 10 wherein the conductive layer is only a refractory metal.

26. The gate structure of claim 18 wherein the conductive layer is only a refractory metal silicide.

27. The gate structure of claim 18 wherein the conductive layer is only a refractory metal.

28. The gate structure of claim 19 wherein the conductive layer is only a refractory metal silicide.

29. The gate structure of claim 19 wherein the conductive layer is only a refractory metal.

* * * * *

UNITED STATES PATENT AND TRADEMARK OFFICE
CERTIFICATE OF CORRECTION

PATENT NO. : 6,967,408 B1
APPLICATION NO. : 09/579402
DATED : November 22, 2005
INVENTOR(S) : Ko It is certified that error appears in the above-identified patent and that said Letters Patent is hereby corrected as shown below:

Title Page, Abstract, line 21, please insert --of-- after "layer".

Col. 6, line 24, please insert --that-- after "dioxide".

Col. 8, lines 23-24, claim 9, please delete "monoc-crystalline" after "said" and insert --mono-crystalline--.

Col. 9, lines 56-57, claim 18, please delete "monoc-crystalline" after "said" and insert --mono-crystalline--.

Col. 10, line 14, claim 19, please delete "Agate" after "19." and insert --A gate--.

Col. 10, lines 28-29, claim 19, please delete "monoc-crystalline" after "said" and insert --mono-crystalline--.

Signed and Sealed this

Twenty-sixth Day of December, 2006

JON W. DUDAS
*Director of the United States Patent and Trademark Office*